(12) United States Patent
Pham et al.

(10) Patent No.: US 7,202,125 B2
(45) Date of Patent: Apr. 10, 2007

(54) LOW-VOLTAGE, MULTIPLE THIN-GATE OXIDE AND LOW-RESISTANCE GATE ELECTRODE

(75) Inventors: Tuan Pham, San Jose, CA (US); Masaaki Higashitani, Cupertino, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 11/021,693

(22) Filed: Dec. 22, 2004

(65) Prior Publication Data

US 2006/0134845 A1    Jun. 22, 2006

(51) Int. Cl.
*H01L 21/8238* (2006.01)
(52) U.S. Cl. .................. 438/200; 438/207; 438/211; 438/219; 438/248
(58) Field of Classification Search ................ 438/200, 438/207, 211, 219, 248
See application file for complete search history.

(56) References Cited

U.S. PATENT DOCUMENTS

| | | | |
|---|---|---|---|
| 5,043,940 | A | 8/1991 | Harari |
| 5,070,032 | A | 12/1991 | Yuan et al. |
| 5,095,344 | A | 3/1992 | Harari |
| 5,172,338 | A | 12/1992 | Mehrotra et al. |
| 5,297,148 | A | 3/1994 | Harari et al. |
| 5,313,421 | A | 5/1994 | Guterman et al. |
| 5,315,541 | A | 5/1994 | Harari et al. |
| 5,343,063 | A | 8/1994 | Yuan et al. |
| 5,661,053 | A | 8/1997 | Yuan |
| 5,716,863 | A | 2/1998 | Arai |
| 5,966,618 | A | 10/1999 | Sun et al. |
| 6,046,935 | A | 4/2000 | Takeuchi et al. |
| 6,172,395 | B1 | 1/2001 | Chen et al. |
| 6,184,093 | B1 | 2/2001 | Sung |
| 6,222,762 | B1 | 4/2001 | Guterman et al. |
| 6,281,075 | B1 | 8/2001 | Yuan et al. |
| 6,417,051 | B1 | 7/2002 | Takebuchi |
| 6,448,126 | B1 | 9/2002 | Lai et al. |
| 6,465,323 | B1 | 10/2002 | Yu et al. |

(Continued)

FOREIGN PATENT DOCUMENTS

EP    1274132    1/2003

(Continued)

OTHER PUBLICATIONS

Higashitani et al., "Multi-Thickness Dielectric for Semiconductor Memory", U.S. Appl. No. 11/020,402, filed Dec. 22, 2004, 27 pages.

(Continued)

*Primary Examiner*—Hsien-Ming Lee
(74) *Attorney, Agent, or Firm*—Parsons Hsue & de Runtz LLP

(57) ABSTRACT

A method of making a memory array and peripheral circuits together on a single substrate forms a dielectric layer, floating gate layer, inter-layer dielectric and mask layer across all regions of the substrate. Subsequently these layers are removed from the peripheral regions and dielectrics of different thicknesses are formed in the peripheral regions according to the voltages of the circuits in these regions. A conductive layer is formed over the memory array and the peripheral circuits to form control gates in the memory array and form gate electrodes in the peripheral regions.

18 Claims, 8 Drawing Sheets

U.S. PATENT DOCUMENTS

| | | |
|---|---|---|
| 6,614,684 B1 | 9/2003 | Shukuri et al. |
| 6,689,653 B1 | 2/2004 | Seah et al. |
| 6,770,932 B2 | 8/2004 | Himeno et al. |
| 6,794,708 B2 * | 9/2004 | Mori .......................... 257/314 |
| 6,815,755 B2 | 11/2004 | Colclaser et al. |
| 6,853,037 B2 | 2/2005 | Kudo et al. |
| 6,891,246 B2 | 5/2005 | Aritome |
| 6,897,524 B2 | 5/2005 | Kamiya |
| 6,964,913 B2 | 11/2005 | Dong et al. |
| 7,015,101 B2 | 3/2006 | Zheng et al. |
| 7,023,049 B2 | 4/2006 | Takebuchi et al. |
| 7,045,850 B2 | 5/2006 | Kim et al. |
| 7,084,035 B2 | 8/2006 | Ueda |
| 2002/0058421 A1 | 5/2002 | Hui et al. |
| 2002/0197800 A1 | 12/2002 | Hashimoto et al. |
| 2003/0235078 A1 | 12/2003 | Chien et al. |
| 2004/0012998 A1 | 1/2004 | Chien et al. |

FOREIGN PATENT DOCUMENTS

| | | |
|---|---|---|
| EP | 1363324 | 11/2003 |

OTHER PUBLICATIONS

Lutze et al., "Self Aligned Non-Volatile Memory Cells and Processes for Fabrication", U.S. Appl. No. 10/799,060, filed Mar. 12, 2004, 41 pages.

"Planarized NVRAM Cell with Self-Aligned BL-BL and WL-BL Isolations", IBM Technical Disclosure Bulletin, IBM Corp. New York, US, vol. 36, No. 2, Feb. 1993, pp. 375-377.

Notification of Transmittal of The International Search Report and The Written Opinion of the International Searching Authority, or the Declaration, corresponding International Application No. PCT/US2005/046448, mailed May 9, 2006, 11 pages.

* cited by examiner

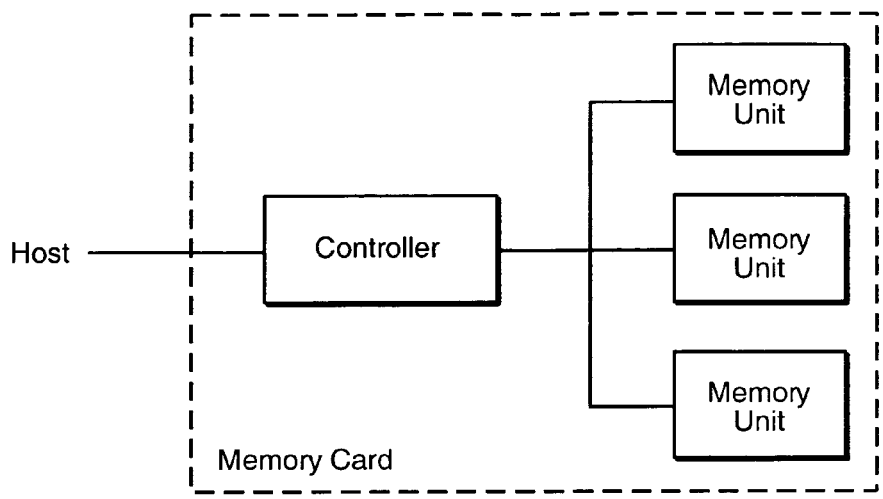
FIG._1
*(PRIOR ART)*
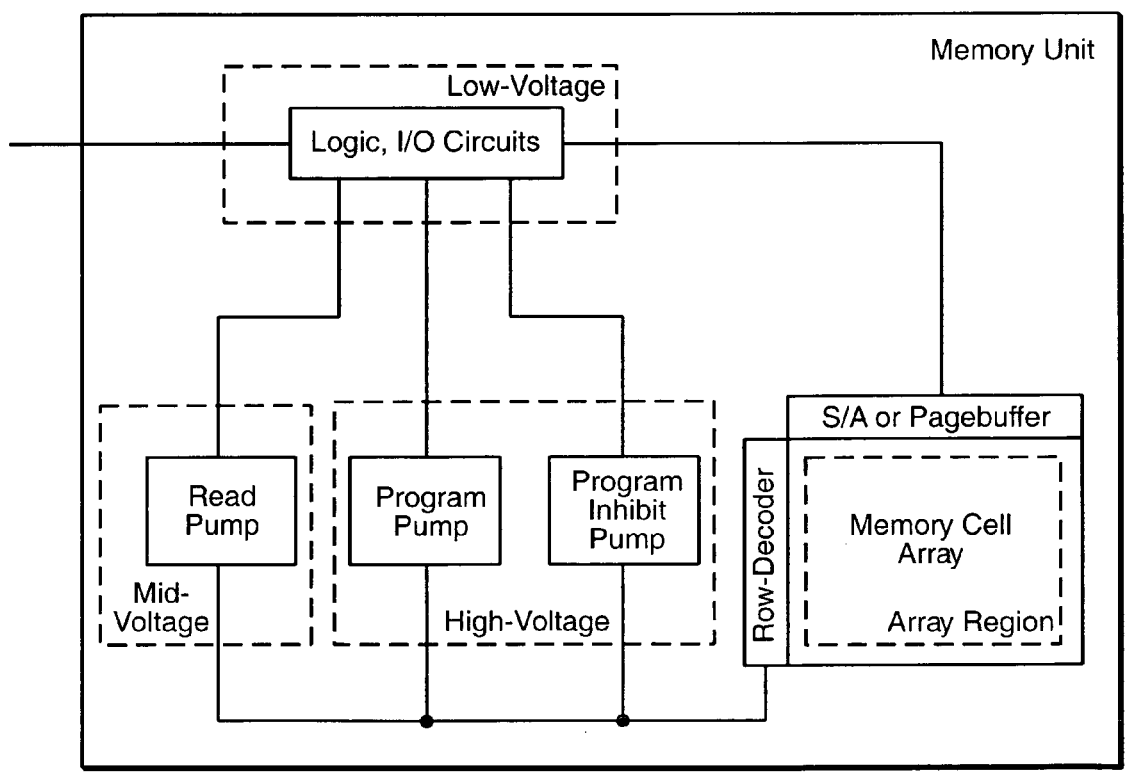
FIG._2
*(PRIOR ART)*

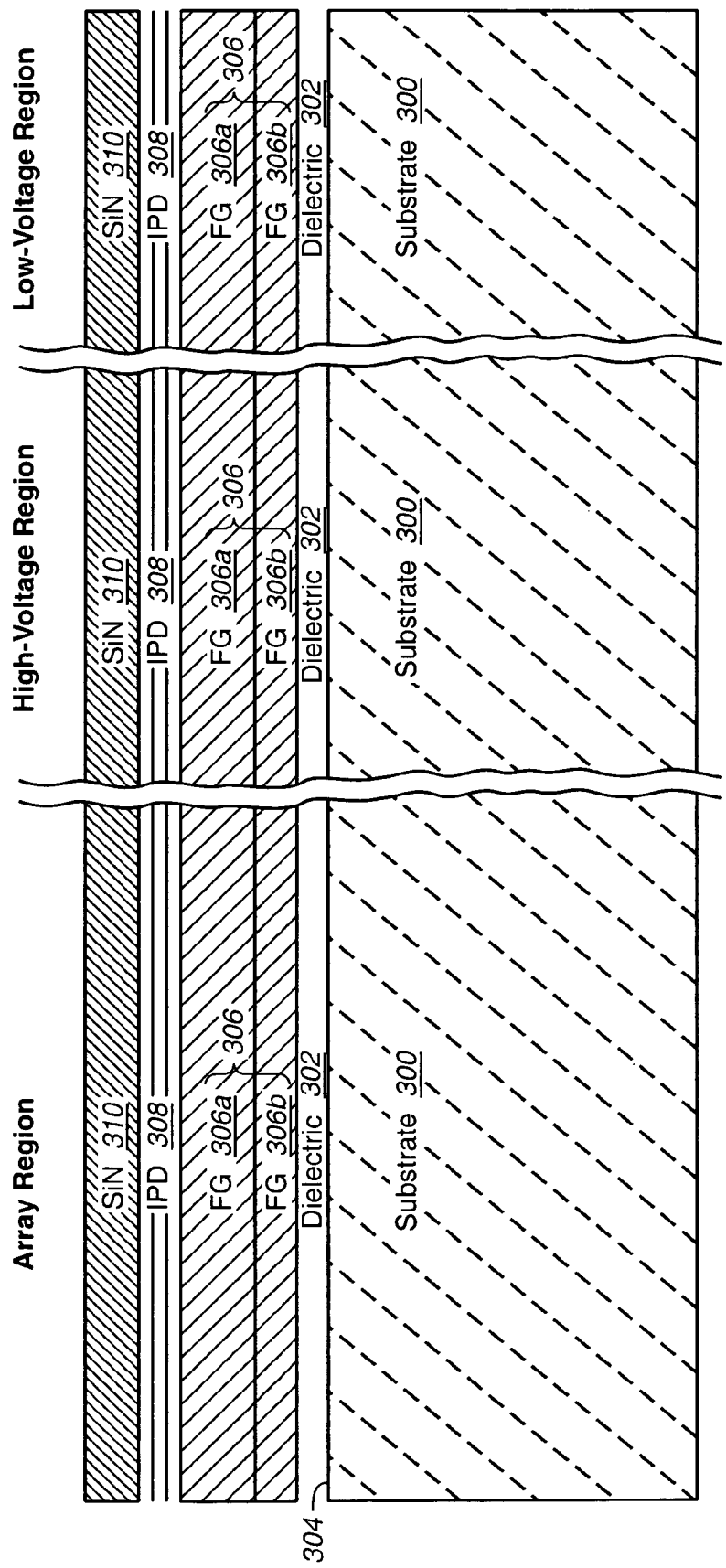
FIG._3

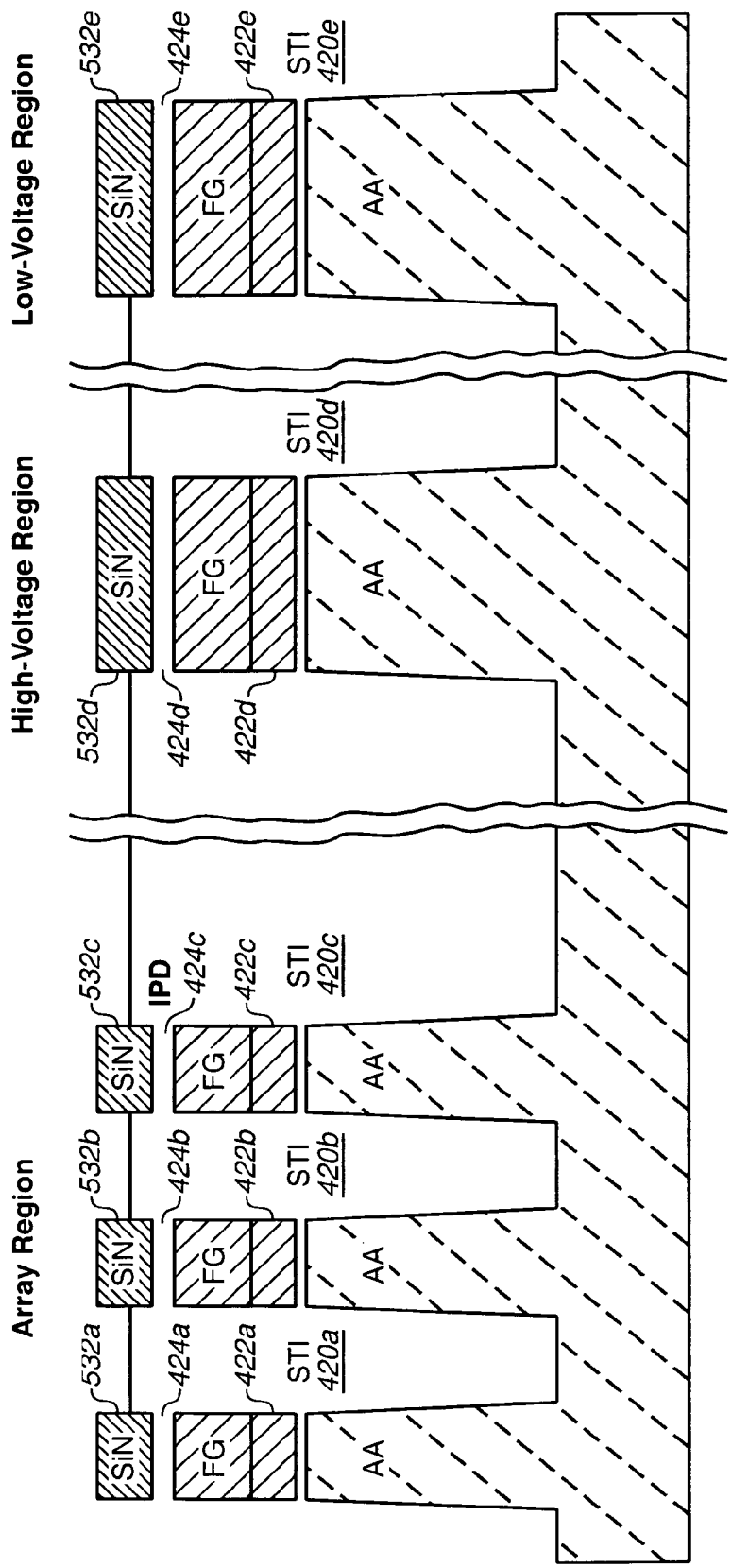
FIG._4

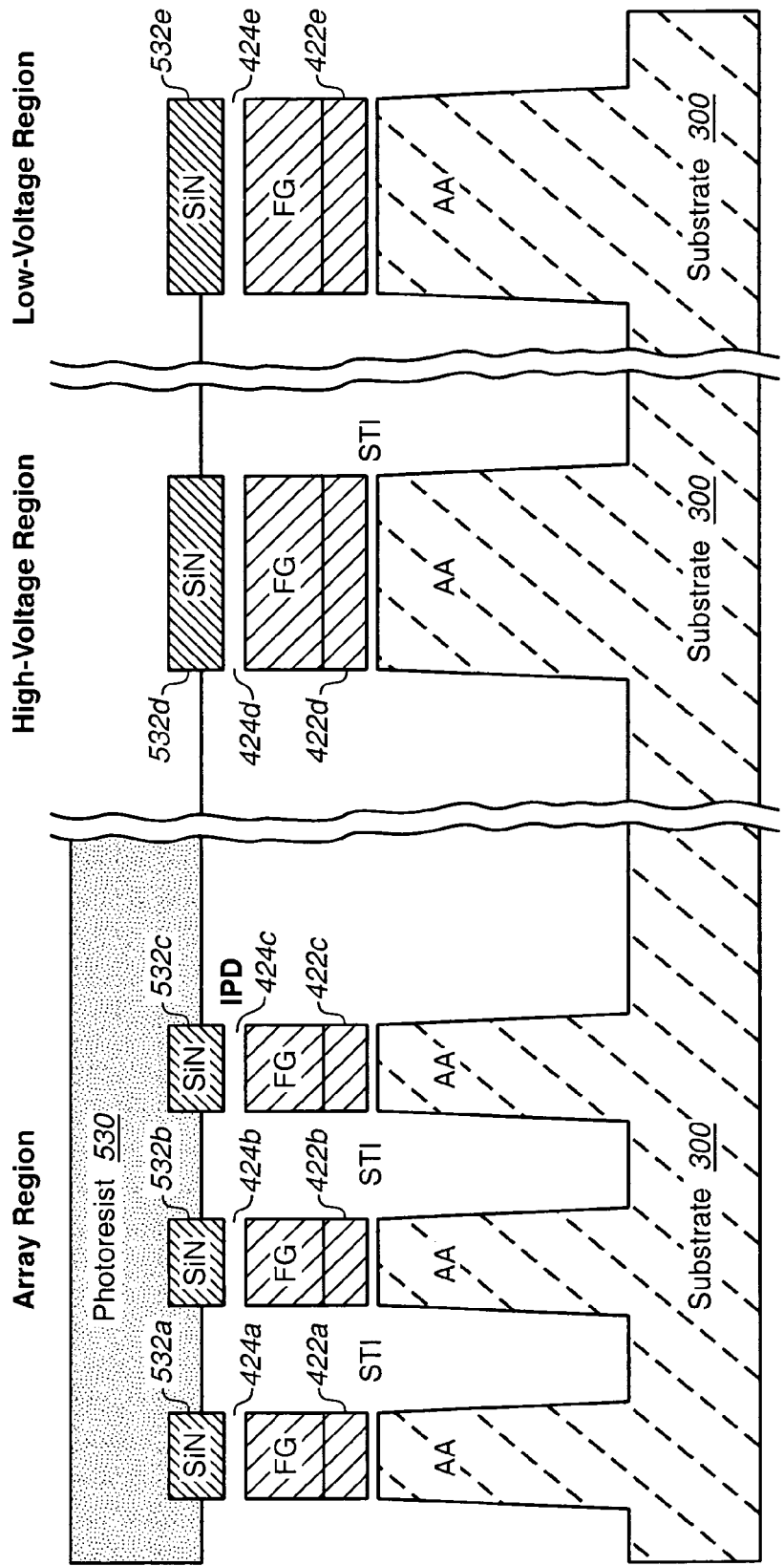
FIG._5

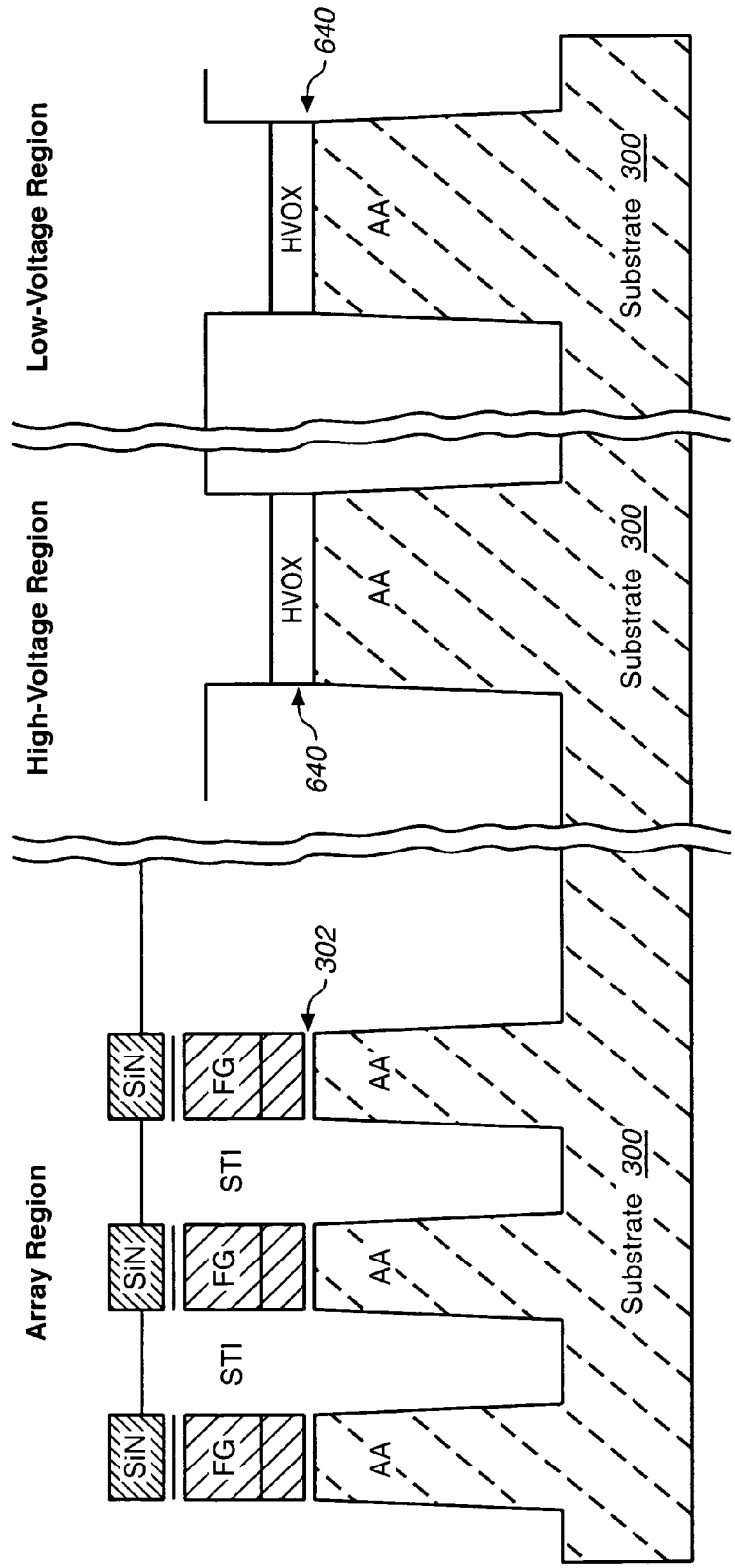
FIG._6

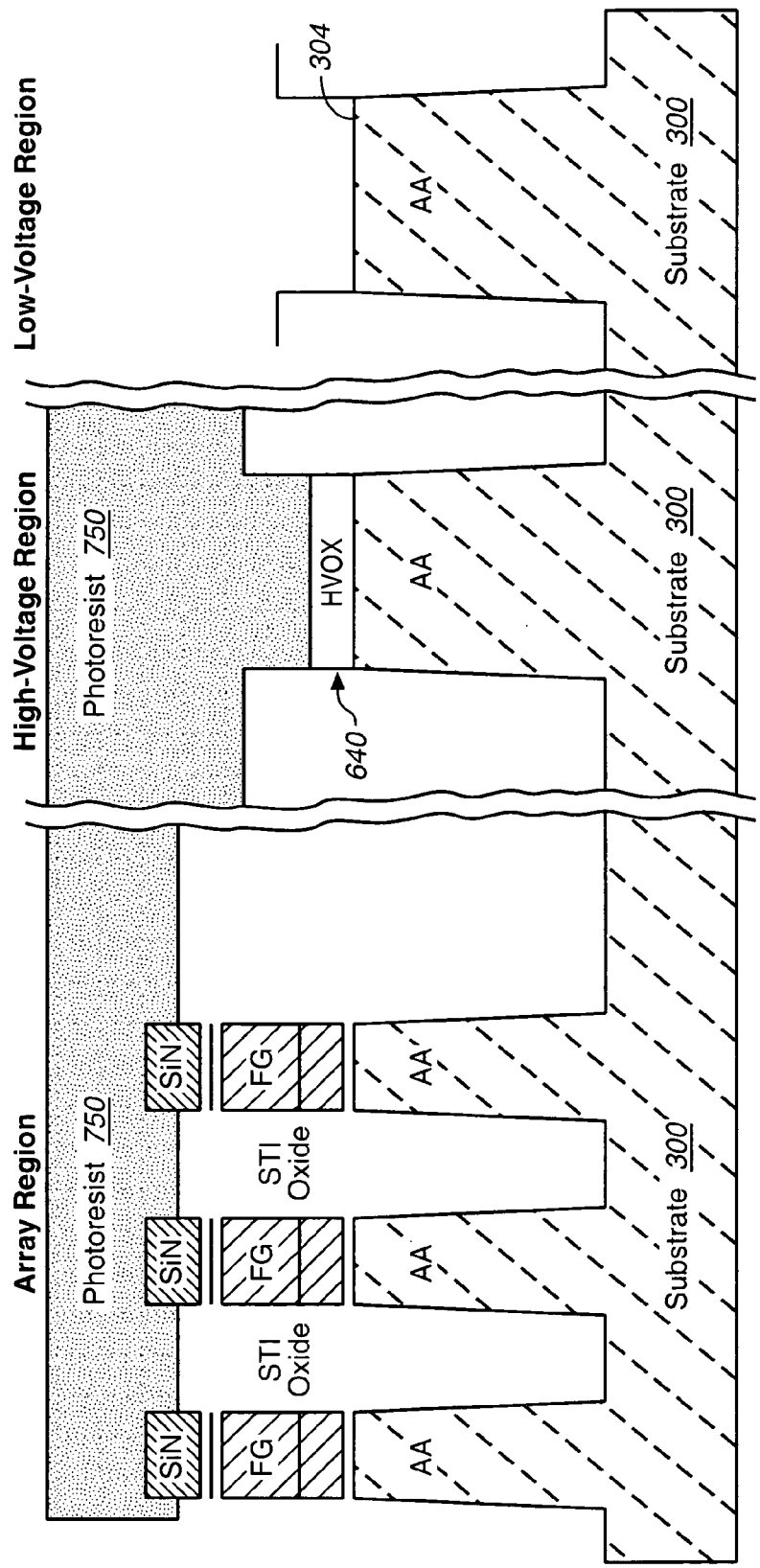
FIG._7

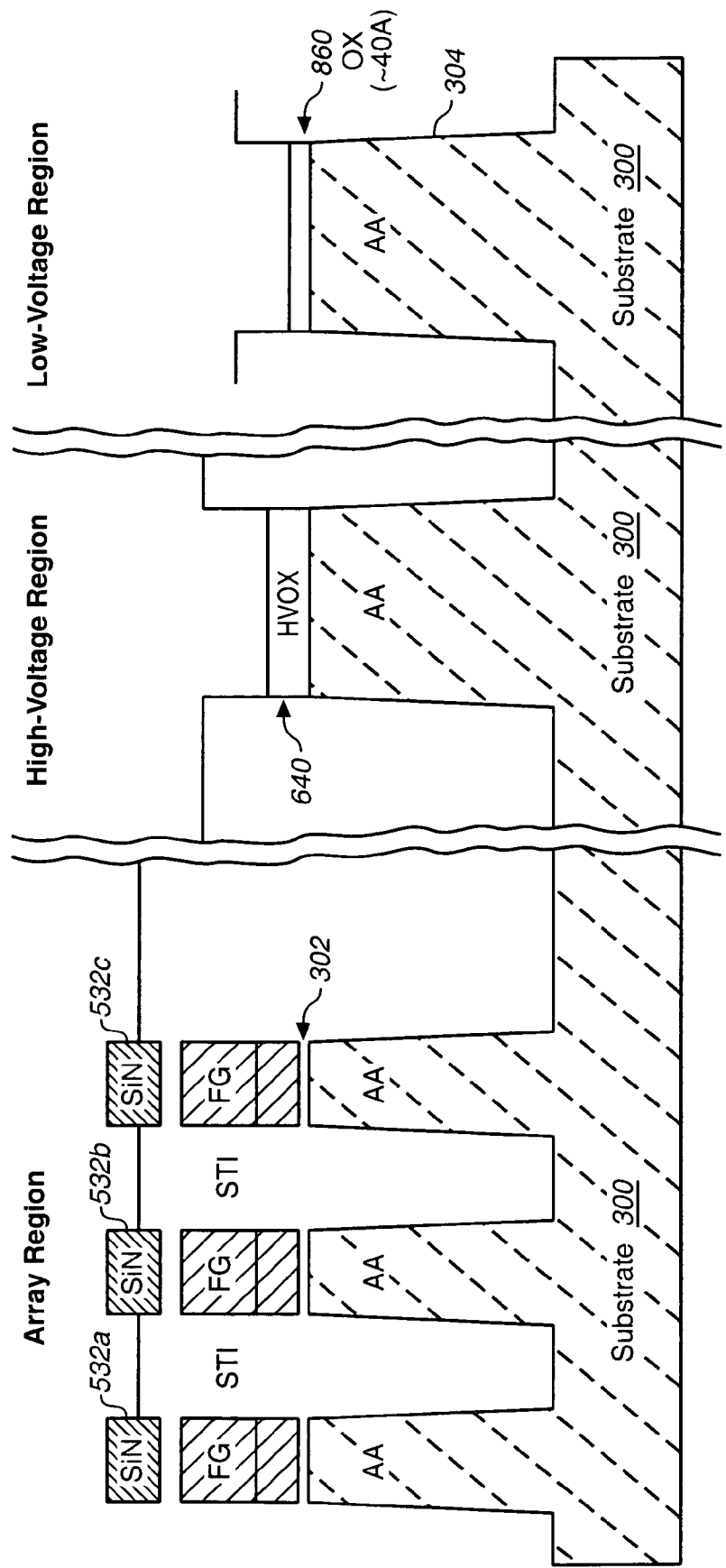
FIG._8

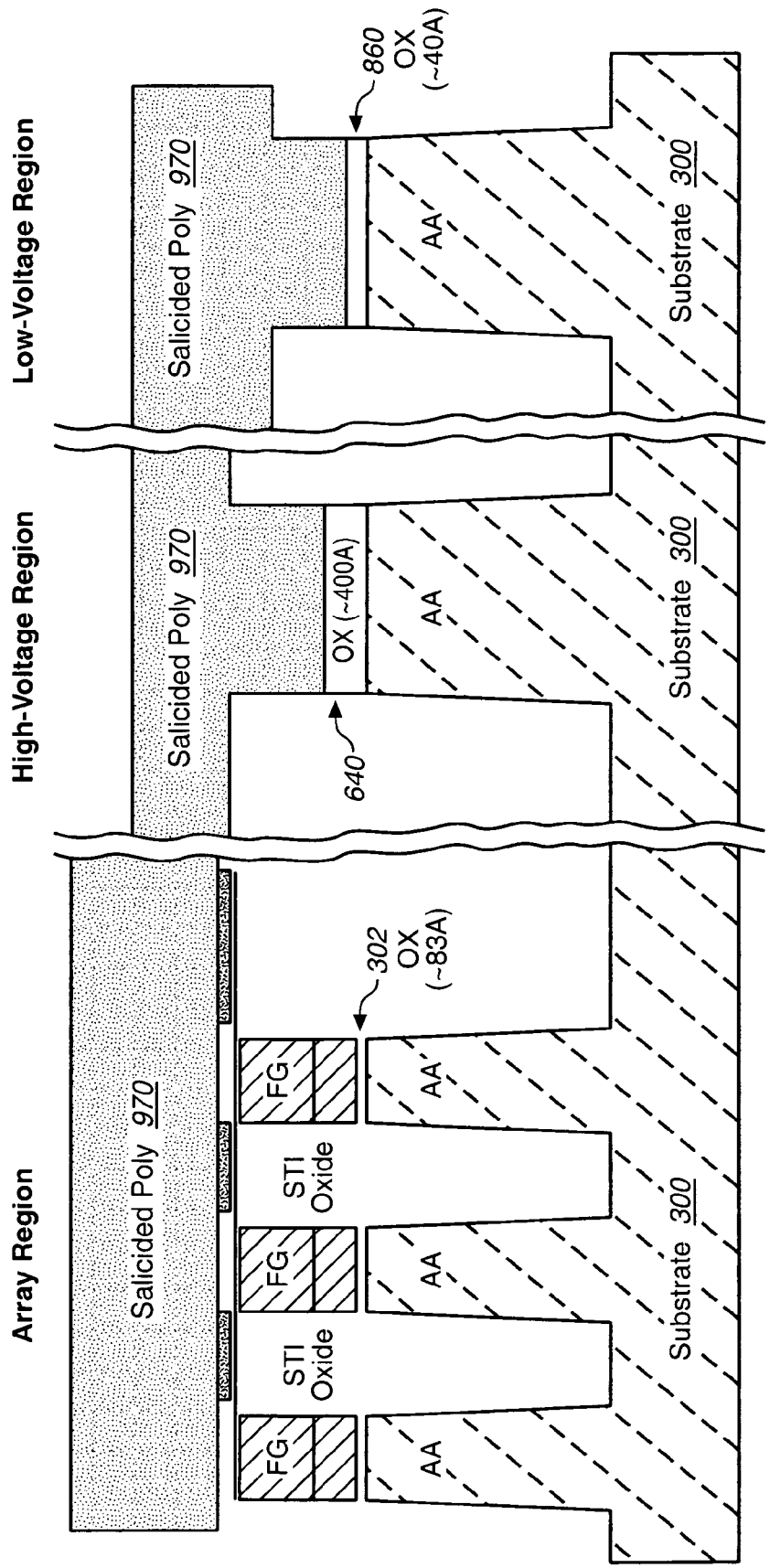
FIG._9

LOW-VOLTAGE, MULTIPLE THIN-GATE OXIDE AND LOW-RESISTANCE GATE ELECTRODE

BACKGROUND

This invention relates generally to non-volatile flash memory systems, and, more specifically to the structures of memory systems, and to the process of forming them.

There are many commercially successful non-volatile memory products being used today, particularly in the form of small form factor cards, which use an array of flash EEPROM (Electrically Erasable and Programmable Read Only Memory) cells. Such cards may be interfaced with a host, for example, by removably inserting a card into a card slot in a host. Some of the commercially available cards are CompactFlash™ (CF) cards, MultiMedia cards (MMC), Secure Digital (SD) cards, Smart Media cards, personnel tags (P-Tag) and Memory Stick cards. Hosts include personal computers, notebook computers, personal digital assistants (PDAs), various data communication devices, digital cameras, cellular telephones, portable audio players, automobile sound systems, and similar types of equipment. An example of a memory card in communication with a host is shown in FIG. 1. The memory card includes a controller and multiple memory units. In some examples just one memory unit is used in a memory card. The memory units and the controller may be formed on the same chip or may be formed on separate chips that are connected together in the memory card. Alternatively, memory systems may be embedded in a larger system such as a personal computer.

A more detailed view of a memory unit such as those of FIG. 1 is shown in FIG. 2. This shows the memory cell array and peripheral circuits. These peripheral circuits are formed on the same substrate as the memory array. Various types of memory array are used. In one type of architecture, a NAND array, a series of strings of more than two memory cells, such as 16 or 32, are connected along with one or more select Word lines extend across cells within a large number of these columns. An individual cell within a column is read and verified during programming by causing the remaining cells in the string to be over driven so that the current flowing through a string is dependent upon the level of charge stored in the addressed cell. An example of a NAND architecture array and its operation as part of a memory system is found in U.S. Pat. No. 6,046,935, which patent is incorporated herein in its entirety by this reference.

In another type of array having a "split-channel" between source and drain diffusions, the floating gate of the cell is positioned over one portion of the channel and the word line (also referred to as a control gate) is positioned over the other channel portion as well as over the floating gate. This effectively forms a cell with two transistors in series, one (the memory transistor) with a combination of the amount of charge on the floating gate and the voltage on the word line controlling the amount of current that can flow through its portion of the channel, and the other (the select transistor) having the word line alone serving as its gate. The word line extends over a row of floating gates. Examples of such cells, their uses in memory systems and methods of manufacturing them are given in U.S. Pat. Nos. 5,070,032, 5,095,344, 5,315,541, 5,343,063, 5,661,053, and 6,281,075, which patents are incorporated herein by this reference in their entirety.

A modification of this split-channel flash EEPROM cell adds a steering gate positioned between the floating gate and the word line. Each steering gate of an array extends over one column of floating gates, perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the floating gate to a desired level through an electric field (capacitive) coupling between the word line and the floating gate. It is often difficult to perform both of these functions in an optimum manner with a single voltage. With the addition of the steering gate, the word line need only perform function (1), while the added steering gate performs function (2). The use of steering gates in a flash EEPROM array is described, for example, in U.S. Pat. Nos. 5,313,421 and 6,222,762, which patents are incorporated herein by this reference in their entirety.

In any of the types of memory cell arrays described above, the floating gate of a cell is programmed by injecting electrons from the substrate to the floating gate. This is accomplished by having the proper doping in the channel region and applying the proper voltages to the source, drain and remaining gate(s).

Two techniques for removing charge from floating gates to erase memory cells are used in the three types of memory cell arrays described above. One is to erase to the substrate by applying appropriate voltages to the source, drain and other gate(s) that cause electrons to tunnel through a portion of a dielectric layer between the floating gate and the substrate. The other erase technique is to transfer electrons from the floating gate to another gate through a tunnel dielectric layer positioned between them. In the second type of cell described above, a third erase gate is provided for that purpose. In the third type of cell described above, which already has three gates because of the use of a steering gate, the floating gate is erased to the word line, without the necessity to add a fourth gate. Although this latter technique adds back a second function to be performed by the word line, these functions are performed at different times, thus avoiding the necessity of making a compromise because of the two functions. When either erase technique is utilized, a large number of memory cells are grouped together for simultaneous erasure, in a "flash." In one approach, the group includes enough memory cells to store the amount of user data stored in a disk sector, namely 512 bytes, plus some overhead data. In another approach, each group contains enough cells to hold several thousand bytes of user data, equal to many disk sectors' worth of data. Multi-block erasure, defect management and other flash EEPROM system features are described in U.S. Pat. No. 5,297,148, which patent is incorporated herein by this reference.

As in most integrated circuit applications, the pressure to shrink the silicon substrate area required to implement some integrated circuit function also exists with flash EEPROM systems. It is continually desired to increase the amount of digital data that can be stored in a given area of a silicon substrate, in order to increase the storage capacity of a given size memory card and other types of packages, or to both increase capacity and decrease size. One way to increase the storage density of data is to store more than one bit of data per memory cell. This is accomplished by dividing a window of a floating gate charge level voltage range into more than two states. The use of four such states allows each cell to store two bits of data, eight states stores three bits of data per cell, and so on. A multiple state flash EEPROM structure and operation is described in U.S. Pat. Nos. 5,043,940 and 5,172,338, which patents are incorporated herein by this reference.

In these and other types of non-volatile memories, the amount of field coupling between the floating gates and the control gates passing over them is carefully controlled. The amount of coupling determines the percentage of a voltage placed on the control gate that is coupled to its floating gates. The percentage coupling is determined by a number of factors including the amount of surface area of the floating gate that overlaps a surface of the control gate. It is often desired to maximize the percentage coupling between the floating and control gates by maximizing the amount of overlapping area. One approach to increasing coupling area is described by Yuan et al in U.S. Pat. No. 5,343,063, which patent is incorporated herein in its entirety by this reference. The approach described in that patent is to make the floating gates thicker than usual to provide large vertical surfaces that may be coupled with the control gates. The approach described in that patent is to increase coupling between the floating and control gates by adding a vertical projection to the floating gate.

Increased data density can also be achieved by reducing the physical size of the memory cells and/or the overall array. Shrinking the size of integrated circuits is commonly performed for all types of circuits as processing techniques improve over time to permit implementing smaller feature sizes. But there are usually limits of how far a given circuit layout can be shrunk in this manner, since there is often at least one feature that is limited as to how much it can be shrunk, thus limiting the amount that the overall layout can be shrunk. When this happens, designers will turn to a new or different layout or architecture of the circuit being implemented in order to reduce the amount of silicon area required to perform its functions. The shrinking of the above-described flash EEPROM integrated circuit systems can reach similar limits.

One way to form small cells is to use a self-aligned shallow trench isolation (STI) technique. This uses STI structures to isolate adjacent strings of floating gate cells. According to this technique, a tunnel dielectric layer and floating gate polysilicon layer are formed first. Next, STI structures are formed by etching the layers and the underlying substrate to form trenches. The portions of the layers between STI structures are defined by the STI structures and are therefore self-aligned to the STI structures. Typically, the STI structures have a width that is equal to the minimum feature size that can be produced with the processing technology used. The portions of the layers between STI regions may also have a width that is equal to the minimum feature size. These strips are further formed into individual floating gates in later steps.

The gate dielectric of a semiconductor device is important to the function of the device. A gate dielectric layer separates a gate from a channel region of a transistor. In a memory array having data stored in floating gates, the floating gates are separated from the underlying substrate by a gate dielectric. Silicon dioxide ($SiO_2$ or "oxide") is a conventional material for gate dielectric layers. Other gate dielectric structures may be used including an oxide-nitride-oxide (ONO) stack. In certain configurations, electrons may tunnel through this gate dielectric to charge the floating gate and so, the gate dielectric acts as a tunnel oxide. Other devices in a flash memory array, such as select transistors in a NAND array, may have a gate dielectric separating a gate that is not floating from the substrate. Gate dielectric layers in devices are generally limited in thickness according to the voltage that is to be applied across the dielectric. It is generally desirable to have a thin gate dielectric layer to improve device performance. However, if the gate dielectric layer is too thin, it may break down when a high voltage is applied across it. Therefore, the gate dielectric layer is designed to be thick enough to withstand the highest voltage that it is expected to endure.

Memory cell arrays may be formed on the same silicon substrate with other circuits to form a memory system. For example, peripheral circuits may be formed on the same chip as the memory array to form a memory unit as shown in FIG. 2. Peripheral circuits may include charge pumps, sense amplifiers, input/output circuits, row decode circuits, clock circuits, registers and logic circuits. Some components may handle higher voltages than others. For example, charge pumps may produce voltages of 20 volts, while logic circuits may only deal with voltages of 1.5 volts. Therefore, the gate dielectric thicknesses required for devices in these components may be different. A charge pump may require a much thicker gate dielectric layer than a logic circuit. Thus, in some examples of memory systems formed on a semiconductor substrate, it may be desirable to form oxide layers of different thicknesses on different regions of the substrate. Circuits may be divided into high-voltage, mid-voltage and low-voltage circuits. In NAND systems, operations may include read, program and erase. A read operation may be performed using less than 5 volts and may be managed by a low-voltage or mid-voltage circuit. A program operation may use approximately 20 volts for programming (using high-voltage circuits) and approximately 7 volts for inhibiting (using mid-voltage circuits). An erase operation may use approximately 20 volts (using high-voltage circuits). In peripheral circuits, it is desirable to use thin gate oxide, particularly for logic operation. FIG. 2 shows a low-voltage region that includes peripheral circuits including logic and input/output (I/O) circuits. A mid-voltage region includes a read pump (a charge pump used for generating voltages used for reading). A high-voltage region includes two charge pumps used during programming. In addition, a memory cell array may be treated as a separate region. Adjacent to the memory cell array are the row decoder and sense amplifier (S/A) circuits. The row-decoder is typically in a high-voltage region while sense amplifiers may be in a low-voltage region.

The tunnel oxide layer that separates the floating gate from the underlying substrate is generally an extremely sensitive part of the memory array. Defects in this layer may cause problems for cell reliability such as endurance problems or data retention problems. After the tunnel oxide layer is formed, it is preferable to protect the layer from damage during the formation of subsequent layers. This may include protection from chemical or physical damage to the tunnel oxide layer.

Therefore, there is a need for a process that provides the advantages of a self-aligned STI process for a memory array formed on a substrate. There is also a need for a process that provides dielectric layers of multiple thicknesses for different devices on the substrate and protects the memory array dielectric layer from damage from subsequent process steps.

SUMMARY

Different gate dielectric layers are formed on different regions of a substrate according to the qualities desired in each region. Gate dielectric layers of different thicknesses may be formed according to the voltages used in particular regions. A first dielectric layer for the gate oxide of the memory array region may be formed across the substrate surface, followed by a floating gate layer, an ONO layer and a mask layer. These layers are formed without patterning so that they are the same across all regions of the substrate. The layers may be formed according to conventional techniques. Next, shallow trench isolation (STI) structures are formed in the substrate. STI structures are formed in all regions by patterning the mask layer and using it as an etch mask to etch trenches into the substrate and the layers overlying the substrate. The formation of STI structures separates portions of the floating gate layer and provides floating gates that are self-aligned to the STI structures. Next, the masking layer, ONO layer, floating gate layer and first dielectric layer are removed in the high-voltage and low-voltage regions and a second dielectric layer is grown on the substrate in these regions. The second dielectric layer is typically thicker than the first dielectric layer used for the memory array region and may be used for relatively high-voltage devices. The second dielectric layer is then removed in the low-voltage region and a third dielectric layer is formed in this region. The third dielectric layer is generally thinner than the first dielectric layer used for the memory array gate oxide. The third dielectric layer is suitable for use in low-voltage or logic devices. Next, a conductive layer is formed to act as a control gate in the array region and to provide a gate electrode for devices in the high-voltage and low-voltage regions. The conductive layer may be formed from doped polysilicon. A metal silicide may also form part of the conductive layer.

BRIEF DESCRIPTION OF THE DRAWINGS

FIG. 1 shows a memory card of the prior art.

FIG. 2 shows a more detailed view of a memory unit on a substrate, including different regions in the substrate.

FIG. 3 shows a substrate having an array region, high-voltage region and low-voltage region, with first dielectric layer, floating gate layer and ONO layer extending across all regions.

FIG. 4 shows the substrate of FIG. 3 after formation of STI structures in the high-voltage, low-voltage and array regions.

FIG. 5 shows the substrate of FIG. 4 with photoresist covering the array region.

FIG. 6 shows the substrate of FIG. 5 after removal of floating-gate and first oxide layers in the high-voltage and low-voltage and subsequent formation of a second dielectric layer in these regions.

FIG. 7 shows the substrate of FIG. 6 having a photoresist film covering the array region and the high-voltage region after removal of the second dielectric layer in the low-voltage region.

FIG. 8 shows the substrate of FIG. 7 after growth of a third dielectric layer in the low-voltage region.

FIG. 9 shows the substrate of FIG. 8 after formation of a conductive layer extending across the array region, high-voltage region and low-voltage region.

DETAILED DESCRIPTION

FIGS. 3–9 show the formation of a memory array and peripheral circuits according to an example of the present invention. The process up to the point shown in FIG. 3 may be done by a conventional method for forming self-aligned memory arrays. Examples of such methods are provided in U.S. patent Publication No. 2005/0199939A1, entitled "Self Aligned Non-Volatile Memory Cells and Processes for Fabrication," filed on Mar. 12, 2004; U.S. Patent No. 6,894,930, entitled, "Deep wordline trench to shield cross coupling between adjacent cells for scaled NAND," U.S. Pat. No. 6,898,121, and U.S. patent application Ser. No. 11/020,402, entitled, "Multi-Thickness Dielectric for Semiconductor Memory," filed on the same date as the present application, which patent applications are hereby incorporated by reference in their entirety. A typical sequence of steps includes deposition of a gate oxide layer, a floating gate layer and subsequent formation of shallow trench isolation (STI) structures.

FIG. 3 shows a substrate 300 having a dielectric layer 302 covering an upper surface 304 of substrate 300. Dielectric layer 302 may be a silicon dioxide (oxide) layer formed by oxidation of surface 304. Typically a thin oxide layer is used. For example, the oxide layer may be 83 Angstroms thick. This oxide may be nitrided and annealed after formation to improve the electrical characteristics of the oxide. Above dielectric layer 302 is a floating gate layer 306. In this example, floating gate layer 306 is made up of two separate layers, 306a and 306b, known as FGs, that are in contact with each other to form a single electrically conductive layer 306. In other examples, the floating gate layer may be formed in a single step or may comprise more than two layers. Floating gate layer 306 may be formed of polysilicon. The polysilicon may be doped with a dopant such as phosphorus to provide desired electrical characteristics. Above the floating gate layer is an Inter Layer Dielectric layer 308 (Inter-Poly Dielectric, or IPD), for example an Oxide-Nitride-Oxide (ONO) layer, $Al_2O_3$, or HfAlO, or any other dielectric material. These layers are generally quite thin with typical thickness of about 40 A to 200 A. Above this IPD layer is a mask layer 310. In this example, mask layer 310 is formed of silicon nitride (SiN). Dielectric layer 302, floating gate layer 306, inter-layer dielectric layer 308 and mask layer 310 each extend across three regions, the array region, high-voltage region and low-voltage region. The processing of each region may be the same up to this point. Thus, the process up to this point does not require any masking of particular regions.

FIG. 4 shows the substrate 300 of FIG. 3 after formation of STI structures 420a–420e in each region. STI structures 420a–420c isolate adjacent floating gate portions 422a–422c in the memory array region. STI structures 420a–420e may be formed by a conventional method by patterning the mask layer 310 into portions 532a–532e and using the resulting patterned layer as an etch mask to etch STI trenches. STI trenches are then filled with silicon dioxide. Because floating gate portions 422a–422e are separated by the same etch step that forms the STI trenches, these elements are considered to be self-aligned. That is, there is no separate alignment required to position the floating gate portions 422a–422e with respect to the STI structures 420a–420e. STI oxide may be formed by a chemical vapor deposition (CVD) process that fills the trench formed in the substrate and in the floating gate layer. Excess silicon dioxide may then be removed by chemical mechanical polishing (CMP). After a CMP step, the STI structures 420a–420e may be etched back to provide the profile shown where silicon nitride portions 532a–532e extends above the STI structures 420a–420e.

FIG. 5 shows the substrate of FIG. 4 with a photoresist layer 530 covering the memory array region. The high-voltage and low-voltage regions remain uncovered at this point. Such a layer of photoresist may be formed by spinning on photoresist over the entire substrate, then exposing the layer according to a pattern so that only the portions of the layer over the high and low voltage regions are removed when the photoresist is developed. Photoresist layer 530 in the memory array region is in contact with portions 532a–532c of the silicon nitride mask layer 310 at this point but is not in contact with the inter-layer dielectric or floating gate layers. Thus, the mask layer portions 532a–532e protect the underlying layers from contact with photoresist layer 530, which may leave residue or cause contamination to layers it contacts.

FIG. 6 shows the substrate 300 of FIG. 5 after removal of the mask layer portions 532d–532e, IPD layer portions 424d–424e, floating gate layer portions 422d–422e and dielectric layer portions in the high-voltage and low-voltage regions. These layers may be removed by etching the mask portions 532d–532e, inter-layer dielectric portions 424d–424e and floating gate portions 422d–422e by reactive ion etching (RIE) and then removing portions of dielectric layer 302 using a dip in Hydrofluoric acid (HF dip). The photoresist layer 530 protects these layers in the array region so that they remain intact there. Photoresist layer 530 is removed after the layers are removed in the high-voltage and low-voltage regions. After the photoresist layer 530 is removed a second dielectric layer 640 (High Voltage Oxide, or HVOX) is formed in the exposed areas of the substrate. The exposed areas at this point are in the high-voltage and low-voltage regions. The second dielectric layer 640 may be grown on substrate 300, for example, by furnace oxidation. The second dielectric layer 640 may be a thicker layer than the first dielectric layer 302. In this case, second dielectric layer 640 is approximately 370 Angstroms thick.

FIG. 7 shows the substrate of FIG. 6 with a second photoresist layer 750 in place covering both the memory array region and the high-voltage region but leaving the low-voltage region open. The second photoresist layer 750 serves to mask the memory array region and high-voltage region during removal of the second dielectric layer 640 in the low-voltage region. The second dielectric layer 640 may be removed from the low-voltage region using a conventional method such as a HF dip. Thus, the substrate surface 304 is exposed in the low-voltage region at this point.

FIG. 8 shows the substrate of FIG. 7 after removal of the photoresist layer 750 and subsequent formation of a third dielectric layer 860 in the low-voltage region. The third dielectric layer 860 may be an oxide layer formed by oxidation of the substrate surface 304 in the low-voltage region. For the low-voltage region a thin dielectric layer is generally preferable. In this example the third dielectric layer 860 is approximately 40 Angstroms thick. This thin dielectric is suitable for logic devices that do not require high voltages. The oxide in the high-voltage region (second dielectric layer 640) is exposed during this oxidation step so that oxidation also takes place in this region, growing the second oxide layer 640 to a thickness of approximately 400 Angstroms.

FIG. 9 shows the substrate 300 of FIG. 8 after removal of the mask layer portions 532a–532c from the memory array region and subsequent deposition of a control gate layer 970. The silicon nitride mask layer portions 532a–532c may be removed using hot phosphoric acid (H3PO4). This etch exposes the upper surface of the IPD layer. After removal of the silicon nitride layer portions 532a–532e, a control gate layer 970 may be deposited. In this example, the control gate layer is formed of polysilicon and tungsten silicide ($WSi_x$). Any other silicide material may also be used in place of tungsten silicide. The control gate layer 970 extends across the memory array region, high-voltage region and low-voltage region. In the memory array region, the control gate layer 970 forms control gates extending along rows of the memory array. In the high-voltage and low-voltage regions, the control gate layer forms gate electrodes of devices formed in these regions. Thus, a single layer may be used for different functions on different parts of the substrate.

Subsequent to the steps shown here, additional steps are performed to produce a final memory array. Additional steps may include patterning the control gate layer to form separate control gates, one or more implant steps and addition of passivation layers.

While the above is a full description of the specific embodiments, various modifications, alternative constructions and equivalents may be used. Therefore, the above description and illustrations should not be taken as limiting the scope of the present invention which is defined by the claims.

It is claimed:

1. A method of forming a non-volatile memory array, high-voltage circuits and logic circuits on a substrate, the array overlying a first region of the substrate, the high-voltage circuits overlying a second region of the substrate and the logic circuits overlying a third region of the substrate, comprising:

forming a first dielectric layer that extends across the first, second and third regions;

forming a floating gate polysilicon layer that extends over the first dielectric layer across the first, second and third regions;

forming an inter-layer dielectric layer that extends directly over the floating gate polysilicon layer across the first, second and third regions;

forming a mask layer that extends over the inter-layer dielectric layer across the first, second and third regions;

subsequently forming a plurality of shallow trench isolation structures that extend into the substrate and that separate portions of the floating gate polysilicon layer; and subsequently removing portions of the floating gate polysilicon layer and portions of the mask layer overlying the second and third regions of the substrate without removing portions of the floating gate polysilicon layer and portions of the mask layer that overlie the first region.

2. The method of claim 1 further comprising subsequently forming a second dielectric layer overlying the second and third regions of the substrate.

3. The method of claim 2 further comprising removing the second dielectric layer overlying the third region and forming a third dielectric layer overlying the third region.

4. The method of claim 3 further comprising removing mask layer portions from the first region and subsequently forming a control-gate polysilicon layer and a control-gate tungsten silicide layer over the first region.

5. The method of claim 1 wherein the inter-layer dielectric layer is an oxide-nitride-oxide (ONO) layer.

6. The method of claim 1 further comprising forming shallow trench isolation structures at interfaces between adjacent regions of the substrate.

7. A method of forming a non-volatile memory array in an array region of a substrate, the non-volatile memory having floating gates that are self-aligned to shallow trench isolation portions and forming peripheral circuits that extend over a high-voltage region and a low-voltage region of the surface of a substrate, comprising:

forming a floating gate dielectric layer of a first thickness that extends over the array region, high-voltage region and low-voltage region;

forming one or more layers of floating gate material that extend directly over the floating gate dielectric layer in the array region, high-voltage region and low-voltage region;

forming an inter-layer dielectric layer that extends directly over the one or more layers of floating gate material in the array region, high-voltage region and low-voltage region;

forming a patterned layer of etch mask material that extends over the inter-layer dielectric layer in the array region, high-voltage region and low-voltage region;

subsequently forming shallow trench isolation structures in the substrate surface in a pattern defined by the etch mask material, thereby dividing the one or more floating gate layers and defining an extent of a floating gate along a first direction;

subsequently removing portions of the floating gate dielectric layer, the one or more layers of floating gate material, the inter-layer dielectric layer and the layer of etch mask material that extend over the high-voltage and low-voltage regions;

subsequently forming a low-voltage dielectric layer of a second thickness over the low-voltage region and a high-voltage dielectric layer of a third thickness over the high-voltage region; and subsequently forming a control gate layer directly overlying the inter-layer dielectric in the array region, directly overlying the low-voltage dielectric layer in the low-voltage region and directly overlying the high-voltage dielectric layer in the high-voltage region.

8. The method of claim 7 wherein the etch mask material is silicon nitride and the inter-layer dielectric layer is comprised of silicon dioxide on silicon nitride on silicon dioxide.

9. The method of claim 7 wherein the control gate layer consists of polysilicon and tungsten silicide.

10. The method of claim 7 wherein the one or more layers of floating gate material consists of two separately deposited layers of polysilicon.

11. The method of claim 7 wherein the layer of etch mask material is formed of silicon nitride.

12. The method of claim 7 wherein the first thickness is approximately 83 Angstroms, the second thickness is approximately 40 Angstroms and the third thickness is approximately 400 Angstroms.

13. A method of forming a non-volatile memory array, high-voltage circuits and logic circuits on a substrate, the array overlying a first region of the substrate, the high-voltage circuits overlying a second region of the substrate and the logic circuits overlying a third region of the substrate, comprising:

forming a first dielectric layer that extends across the first, second and third regions;

forming a floating gate polysilicon layer that extends over the first dielectric layer across the first, second and third regions;

forming an inter-layer dielectric layer that extends directly over the floating gate polysilicon layer across the first, second and third regions;

forming a mask layer that extends over the inter-layer dielectric layer across the first, second and third regions;

subsequently forming a plurality of shallow trench isolation structures that extend into the substrate and that separate portions of the floating gate polysilicon layer;

subsequently removing portions of the first dielectric layer, portions of the floating gate polysilicon layer and portions of the mask layer overlying the second and third regions of the surface without removing portions of the first dielectric layer, portions of the floating gate polysilicon layer and portions of the mask layer that overlie the first region; and subsequently forming a second dielectric layer overlying the second region and forming a third dielectric layer overlying the third region.

14. The method of claim 13 further comprising, subsequent to forming the second dielectric layer and the third dielectric layer, forming a control gate layer overlying the first, second and third regions.

15. The method of claim 14 wherein the control gate layer directly overlies the inter-layer dielectric layer over the first region, the control gate layer directly overlies the second dielectric layer over the second region and the control gate layer directly overlies the third dielectric layer over the third region.

16. The method of claim 14 wherein the control gate layer is formed of polysilicon and a metal silicide.

17. The method of claim 13 wherein the second dielectric layer is formed overlying the second and third regions and is later removed from the third region prior to formation of the third dielectric layer.

18. The method of claim 13 wherein the first dielectric layer is thinner than the second dielectric layer and the first dielectric layer is thicker than the third dielectric layer.

* * * * *